(12) United States Patent
Wang et al.

(10) Patent No.: US 12,068,232 B2
(45) Date of Patent: Aug. 20, 2024

(54) INTEGRATED CIRCUIT PACKAGE WITH SERPENTINE CONDUCTOR AND METHOD OF MAKING

(71) Applicant: Avago Technologies International Sales Pte. Limited, Singapore (SG)

(72) Inventors: Michael Wang, Irvine, CA (US); Cheng Lee, Irvine, CA (US); Joon Yeob Lee, Irvine, CA (US); Reza Sharifi, Irvine, CA (US); Liming Tsau, Irvine, CA (US); Junfei Zhu, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 133 days.

(21) Appl. No.: 17/514,722

(22) Filed: Oct. 29, 2021

(65) Prior Publication Data

US 2023/0138918 A1    May 4, 2023

(51) Int. Cl.
*H01L 25/00* (2006.01)
*H01L 23/498* (2006.01)
*H01L 23/538* (2006.01)

(52) U.S. Cl.
CPC .... *H01L 23/49838* (2013.01); *H01L 23/4985* (2013.01); *H01L 23/49866* (2013.01); *H01L 23/5386* (2013.01); *H01L 23/5387* (2013.01); *H01L 25/50* (2013.01)

(58) Field of Classification Search
CPC .......... H01L 23/4985; H01L 23/49838; H01L 23/5386; H01L 23/5387; H01L 21/4846
See application file for complete search history.

(56) References Cited

U.S. PATENT DOCUMENTS

| | | | | |
|---|---|---|---|---|
| 9,418,965 | B1* | 8/2016 | Li | H01L 21/4857 |
| 11,348,875 | B2* | 5/2022 | Sinha | H01L 24/48 |
| 2018/0240778 | A1* | 8/2018 | Liu | H01L 23/5381 |
| 2022/0102288 | A1* | 3/2022 | Hung | H01L 21/50 |
| 2022/0415742 | A1* | 12/2022 | Sahu | H01L 25/0657 |
| 2023/0138918 | A1* | 5/2023 | Wang | H01L 23/562 |
| | | | | 257/668 |
| 2023/0267883 | A1* | 8/2023 | Long | H10K 59/129 |
| | | | | 345/205 |

* cited by examiner

*Primary Examiner* — Thao P Le
(74) *Attorney, Agent, or Firm* — Foley & Lardner LLP

(57) ABSTRACT

An integrated circuit (IC) package includes a one or more die and an interposer. The interposer is coupled to the die and includes circuit traces. The circuit traces are provided in a serpentine configuration. A method can be used to fabricate an integrated circuit package. The method can use an interposer circuit traces having a configuration that allows the circuit traces to deform under stress, and return to an original state undamaged more readily than a straight conductive trace.

20 Claims, 6 Drawing Sheets

INTEGRATED CIRCUIT PACKAGE WITH SERPENTINE CONDUCTOR AND METHOD OF MAKING

BACKGROUND OF THE DISCLOSURE

One or more integrated circuits (ICs) can be provided on or within a module or integrated circuit (IC) package. The IC package can be a multi-chip module or a single chip package. Each of the one or more ICs is generally provided on a die that is connected by fine wires or by solder bumps to an interposer or package substrate. The interposer can be attached to a package substrate. Interposers and package substrates are often manufactured from a material such as silicon. The single chip package or multichip module often includes a cover or other protective structure that covers the one or more ICs. The term integrated circuit or IC package as used herein includes single chip packages and multi-chip modules.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Figure 1:
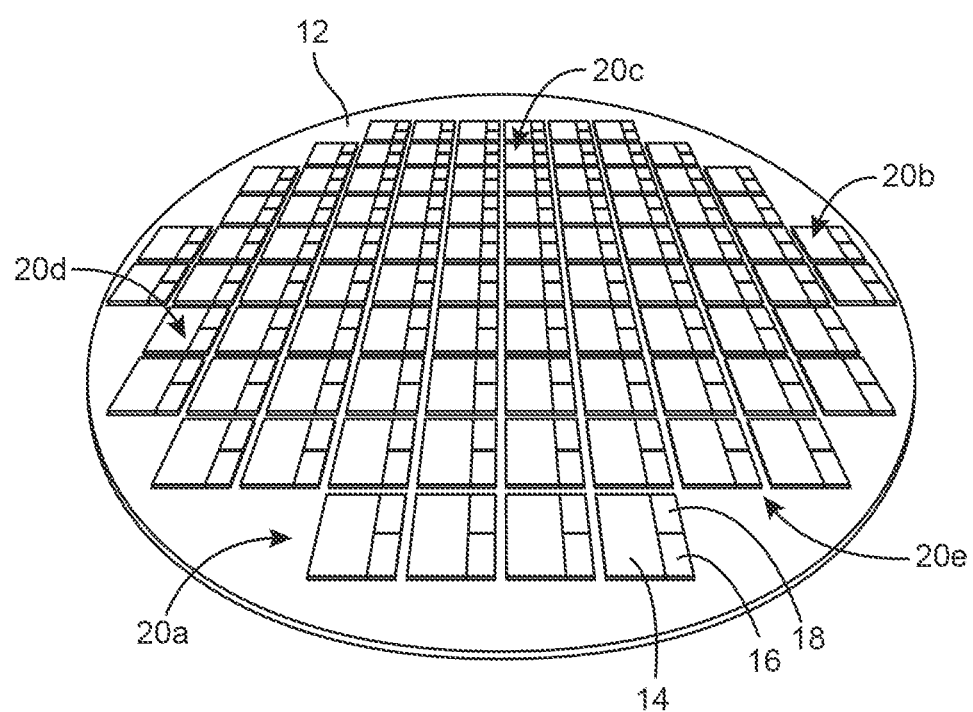
FIG. 1 is a perspective view schematic drawing of sets of IC die attached to an interposer wafer according to some embodiments.

Before turning to the features, which illustrate some exemplary embodiments in detail, it should be understood that the application is not limited to the details or methodology set forth in the description or illustrated in the Figures. It should also be understood that the terminology is for the purpose of description only and should not be regarded as limiting.

Referring generally to the figures, electronic devices can be provided in IC packages (e.g., as single chip packages having a single IC or as a system in package (SiP) or heterogeneous package having two or more ICs or die or passive components in a package (e.g., a multi-chip module)) according to various exemplary embodiments. In some embodiments, IC packages and methods utilize conductive traces on an interposer or package substrate that are more robust than conventional straight conductive traces and withstand deformation without degradation. In some embodiments, the conductive traces are spring assisted, serpentine surface traces. In some embodiments, conductive traces on the interposer or package substrate are configured to absorb warpage stress imparted by the interposer better than a conventional straight line conductive trace. The trace under the die gap experiences high transverse load induced by warpage of the interposer. By routing the trace as a zig-zag or serpentine trace under the die gap, trace density within that locale increases and the trace exhibits a fundamental characteristic of a coil spring: elasticity, according to some embodiments. Elasticity helps the serpentine trace withstand higher levels of warpage stress as opposed to a straight trace in some embodiments.

In some embodiments, traces are straight on some portions of the interposer and in a serpentine configuration on other portions of the interposer. The portion of the interposer including conductive traces in a serpentine configuration are associated with areas subject to deformation or warpage (e.g., between die or in die gaps). The conductive traces are located on any layer (e.g., top, middle, penultimate, bottom, etc.) of a multilayer interposer or package. In some embodiments, the interposer is not an entirely silicon interposer and is an interposer including organic material.

According to some embodiments, a package includes a one or more die and an interposer. The interposer is coupled to the die and includes circuit traces. The circuit traces are provided in a serpentine configuration.

In some embodiments, the interposer includes a flexible material, such as an organic material. In some embodiments, the circuit traces in the serpentine configuration are provided in gaps between the two or more die attached to the interposer. In some embodiments, the serpentine configuration is comprised of repeating units, wherein each repeating unit includes four segments. In some embodiments, a base segment is provided between two side segments at an obtuse interior angle.

According to some embodiments, a method is used to fabricate an integrated circuit package. The method includes providing an interposer. The interposer includes circuit traces which are provided in a serpentine configuration. The method also includes attaching a first die to the interposer and attaching a second die to the interposer. The second die is separated from the first die by an area which includes at least a portion of the circuit traces in the serpentine configuration.

According to some embodiments, an apparatus includes two or more die, each including an integrated circuit. The apparatus also includes an interposer board coupled to the two or more die. The interposer board includes circuit traces having a configuration that allows the circuit traces to deform under stress and return to an original state undamaged more readily than a straight conductive trace.

With reference to FIG. 1, sets 20*a-e* of IC die 14, 16, and 18 are attached to an interposer wafer 12. Although three IC die 14, 16, and 18 of particular shapes and sizes are shown, other numbers (1, 2, 4, 5, etc.) of IC die and different shapes and sizes of IC die can be utilized. In some embodiments, each of IC die 14, 16, and 18 in each of sets 20*a-e* is a different size and shape. In some embodiments, IC die 14 is a large die and IC die 16, and 18 are smaller die of the same size. Interposer wafer 12 can include any number of sets 20*a-e* of die 14, 16, and 18.

Die 14, 16 and 18 can each be any type of electronic device including a memory, a processor, a radio frequency circuit, programmable logic device, application specific integrated circuit (ASIC), or other logic device. In some embodiments, die 16 is a DRAM or high bandwidth memory (HBM) chip, die 14 is a graphics processor, computer, controller, or a type of processor chip, and die 18 is an input/output module. In some embodiments, sets 20*a-e* are associated with a high performance, feature rich packet processor, traffic manager and fabric device. Die 14, 16, and 18 are coupled to the interposer wafer 12 via set of solder balls, solder bump, wires, or other structures in some embodiments.

Interposer wafer 12 can be any material suitable for mounting die 14, 16, and 18. In some embodiments, interposer wafer 12 is more flexible than an entirely silicon or ceramic wafer and can be a soft material that is subject to bending at higher temperatures associate with reflow processes. Interposer wafer 12 can be an organic substrate such as FR4, Rogers, Polyimide or other relevant materials. In some embodiments, interposer wafer 12 is an inorganic substrate such as Gallium Arsenide (GaAs), Gallium Nitride (GaN), Silicon Carbide (SiC) or other material. Interposer wafer 12 is cut into pieces or units that serve as an electrical interface for routing between one socket and connection to another for the sets 20*a-e* of the IC die 14, 16, and 18 on the unit. The interposer unit spreads a connection to a wider pitch or re-routes a connection to a different connection using redistribution layers and serves as a bridge in some embodiments. The interposer wafer 12 includes conductive traces and pads for signals to and from the IC die 14, 16, and 18 in some embodiments. The conductive traces are narrow traces that provide a transmission highway allowing die 14, 16, and 18 to communicate within an IC package in some embodiments.

Thermal energy applied during IC package assembly for the sets 20*a-e* causes materials to expand and shrink as dictated by the material's coefficient of thermal expansion (CTE). CTE mismatch between materials can produce undesirable effects at the package level, one of which is bending, commonly known as warpage. Warpage affects the IC package adversely, adding stress and strain to the package and becomes more of a problem as interposer sizes increase. Thin copper traces, such as those used in high bandwidth memory communication, are prone to the adverse effects induced by warpage. Higher input output (I/O) density requires thinner trace sizes which are more prone to cracking. In some embodiments, the thin copper traces are provided on the interposer wafer 12 in a serpentine configuration to reduce the adverse effects caused by warpage. Adverse effects such as cracking can be reduced by having identical top die. However, designing the top die to exact dimensions is not possible or practical in certain applications. For example, 2.5D packages often utilize an HBM die which is very small compared to a mother die. In some embodiments, a serpentine trace can be advantageously implemented at no extra cost on the interposer board to reduce the adverse effects (e.g., conductive trace cracking).

Figure 2:
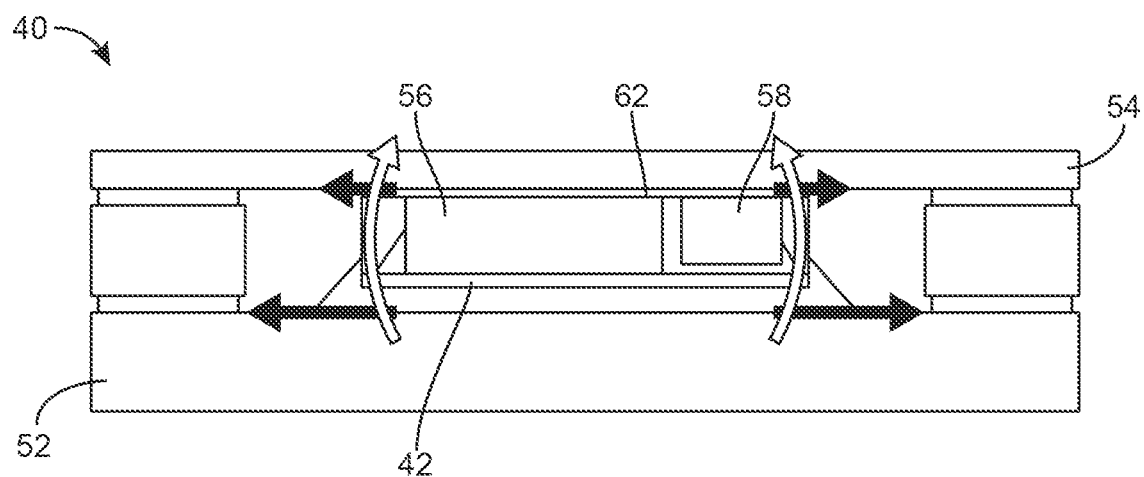
FIG. 2 is a cross sectional view schematic drawing of an IC package showing a cover, a pair of IC die, and an interposer, according to some embodiments.

With reference to FIG. 2, an IC package 40 (e.g., system in package (SiP)) includes cover 54, a package substrate 52, an interconnect or interposer board 42, a die 56, a die 58, and thermal interface material 62. IC package 40 is a single die package or a multiple die package and can include one or more passive components in some embodiments. IC package 40 is configured for side-by-side die packaging, three dimensional packaging, embedded packaging, and other configurations for containing one or more of die 56 and 58. IC package 40 and components thereof can have a variety thicknesses and sizes depending on die area and system criteria. IC package 40 can be formed using sets 20*a-e* on interposer wafer 12 (FIG. 1).

A set of solder balls can couple interposer board 42 to die 56 and 58 in some embodiments. The die 56 and 58 are coupled to the interposer board 42 in a flip chip configuration in some embodiments. The connection can be with pins, solder bumps, wires, or other structures for coupling die 56 and 58 to interposer board 42 or other circuit boards, other devices, or substrates in some embodiments. In some embodiments, die 56 and 58 are coupled directly to the package substrate 52 by solder balls, pins, solder bump, wires, or other structures. Although two die 56 and 58 are shown, interposer board 42 can house a larger or smaller number of die.

Die 56 and 58 can be any type of electronic device including a memory, a processor, a radio frequency circuit, programmable logic device, application specific integrated circuit (ASIC), or other logic device. In some embodiments, die 58 is a DRAM or high bandwidth memory (HBM) chip, and die 56 is a mother die (e.g., a computer, graphics, communication, controller, or other processor chip). A set of solder balls can be provided on a bottom of substrate 52 for coupling to circuit boards or other components. The IC package 40 can contain a high performance, feature rich packet processor, traffic manager and fabric device in some embodiments.

The substrate 52 and interposer board 42 can be any type of IC package circuit board. In some embodiments, interposer board 42 is made from (e.g., cut from) interposer wafer 12 (FIG. 1) and package substrate 52 is a silicon or ceramic material. In some embodiments, interposer board 42 and package substrate 52 are alumina, aluminum nitride or beryllium oxide, flex, or fiberglass circuit boards. Package substrate 52 and interposer board 42 can be single layer or multiple layer circuit boards. Package substrate 52 and interposer board 42 are organic material in some embodiments.

Cover 54 is a metal, metal composite, or ceramic material in some embodiments. Cover 54 is adhered to substrate 52 in some embodiments. Cover 54 can be coupled to or integrated with a heat sink for heat dissipation in some embodiments. Cover 54 is tungsten, copper, copper-diamond, silver-diamond, aluminum, silicon carbide, gold, nickel, and alloys thereof in some embodiments.

Figure 3:
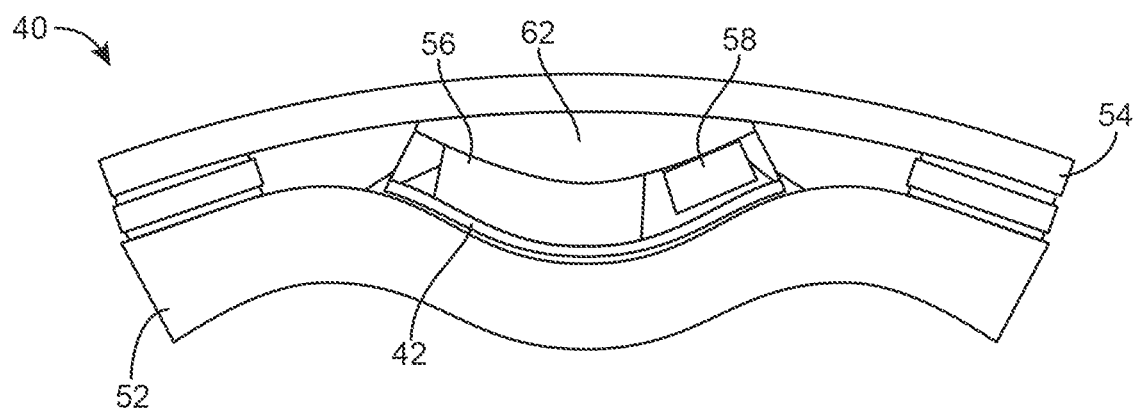
FIG. 3 is a cross sectional view schematic drawing of the IC package illustrated in FIG. 2 undergoing an exaggerated deformation according to some embodiments.
Figure 4:
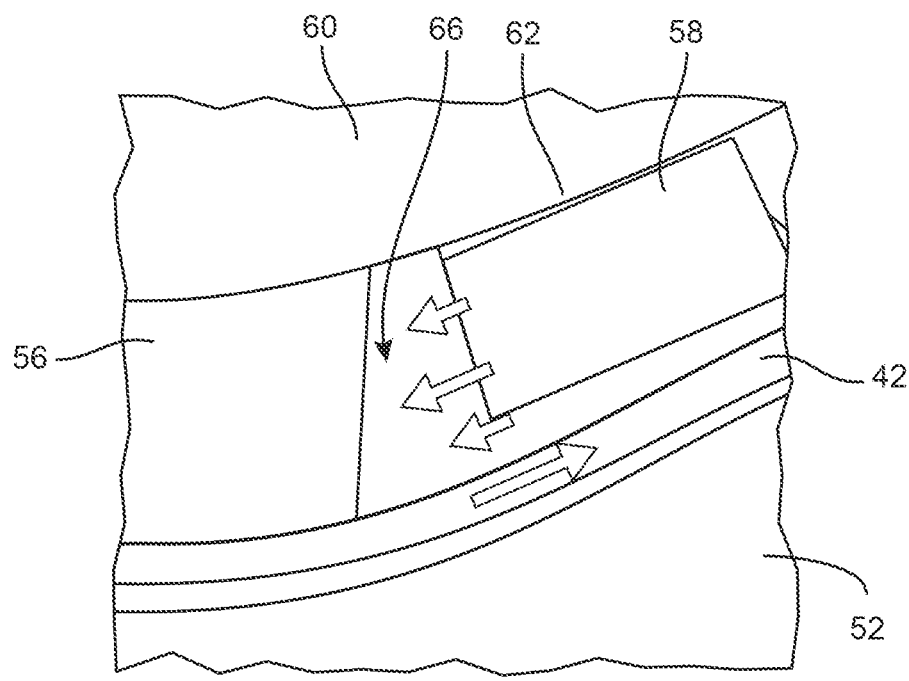
FIG. 4 is a cross sectional view schematic drawing of a portion of the IC package illustrated in FIG. 3 according to some embodiments.

With reference to FIGS. 3 and 4, IC package 40 is subjected to stress causing warpage where interposer board 42 is deformed. Interposer board 42 which is not stiff in some embodiments (e.g., organic interposer boards) can be more susceptible to warpage. In certain conditions, the interposer board 42 bends most pronouncedly at a gap 66 shown in FIG. 4 between die 56 and 58. Arrows in FIGS. 2 and 4 show forces enacted on package 40. Below gap 66 lies dense, fine copper traces which act as the transmission highway between the two top die 56 and 58 in some embodiments. Similar gaps may exist between other adjacent top IC die on the interposer board 42. The absence of hard silicon directly above the gap 66 is filled by a softer under fill material. The gap 66 disrupts the continuity of silicon material across the top of the interposer board 42, hence creates an axis where the interposer board 42 is more likely to bend. Interposer board 42 includes conductive traces in a serpentine configuration at the gap 66 and at other portions of the interposer board 42. In some embodiments, the gap 66 is 70 microns wide. The serpentine pattern advantageously increases the amount of bending force that a straight trace would otherwise absorb.

Figure 5:
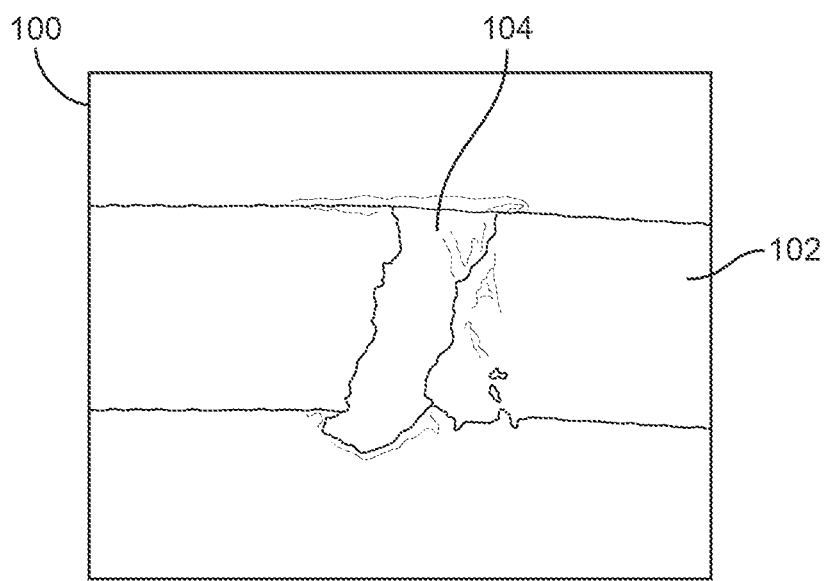
FIG. 5 is a cross sectional view schematic drawing of a conductive trace having a defect due to bending.

With reference to FIG. 5, the warpage of the interposer board 100 induces stress on a trace 102, eventually overcoming the fracture strength of the trace 102. Trace 102 is defective at a crack 104. Crack 104 can result in an open circuit associated with trace 102. Configuring trace 102 to be more flexible (e.g., by providing a serpentine configuration) reduces the susceptibility of trace 102 to having a crack when interposer board 100 is deformed according to some embodiments.

Figure 6:
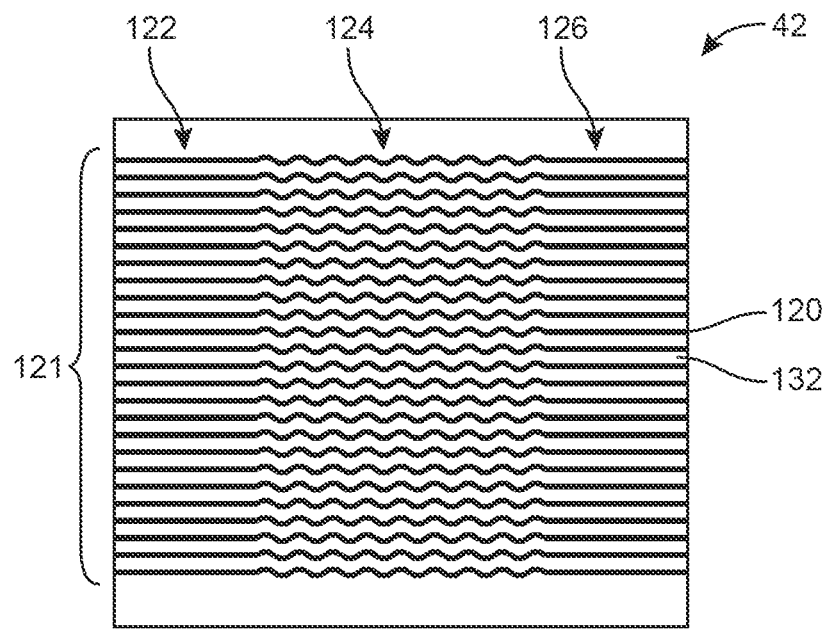
FIG. 6 is a top view schematic drawing of a portion of the interposer of the IC package illustrated in FIG. 3, where the portion of the interposer includes conductive traces in a serpentine configuration according to some embodiments.

With reference to FIG. 6, a portion 120 of interposer board 42 (FIG. 3) includes conductive traces 121 (e.g., copper conductive traces or printed wires). Portion 120 is a first, second, third, fourth, bottom, or other level of interposer board 42. Traces 121 each include a straight portion 122, a serpentine portion 124, and a straight portion 126. Straight portions 122 and 126 can be provided under IC die such as die 56 and 58, while portion 124 is provided in the die gap 66 (FIG. 4). In some embodiments, the serpentine portion 124 begins at a die boundary associated with die 56 and ends at a die boundary associated with die 58.

Figure 7:
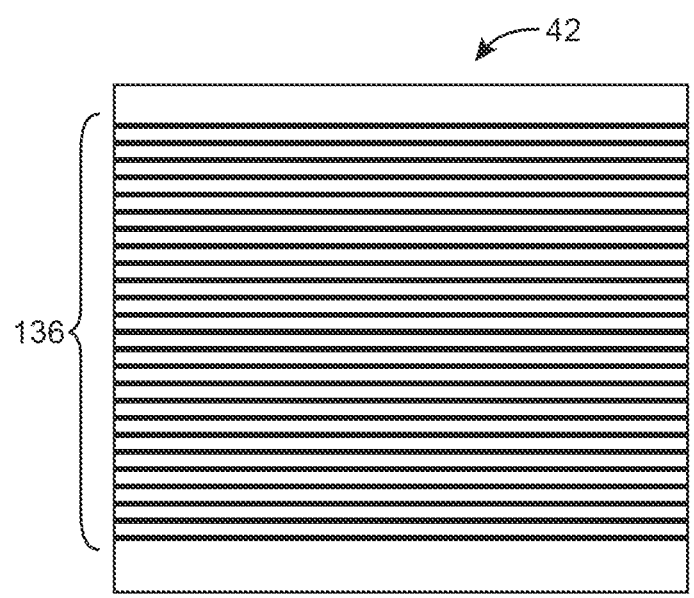
FIG. 7 is a top view schematic drawing of a portion of an interposer having straight conductive traces.

Serpentine portion 124 is any configuration for reducing the susceptibility to cracking due to warpage. The serpentine configuration provides more elasticity (e.g., spring like) than the configuration of straight portions 122 and 126. In some embodiments, the serpentine configuration 86 has a wavelike, saw tooth, or oscillating pattern. Although a sinusoidal pattern is shown in FIG. 6 for the serpentine portion 124, other patterns can be utilized. In some embodiments, the serpentine configuration has a squiggly form in two dimensions formed by bi-arc segments. In some embodiments, the serpentine configuration is a configuration that increases the linear length and material within the trace from on point to another as compared to a straight line. Traces 136 of FIG. 7 are disposed in a straight line.

Traces 121 are 2 microns thick and separated by a gap 132 of 4 microns in some embodiments. Traces 121 are formed using lithography and etching in some embodiments. Traces 121 can be in a range of thicknesses (e.g., 1-5 microns) and can have a range of minimum gap sizes of 2-10 microns depending on design rules, system criteria and fabrication parameters. In some embodiments, a minimum gap is equal to the width of each trace (e.g., 1 micrometer wide trace has a 1 micrometer gap space).

Figure 8:
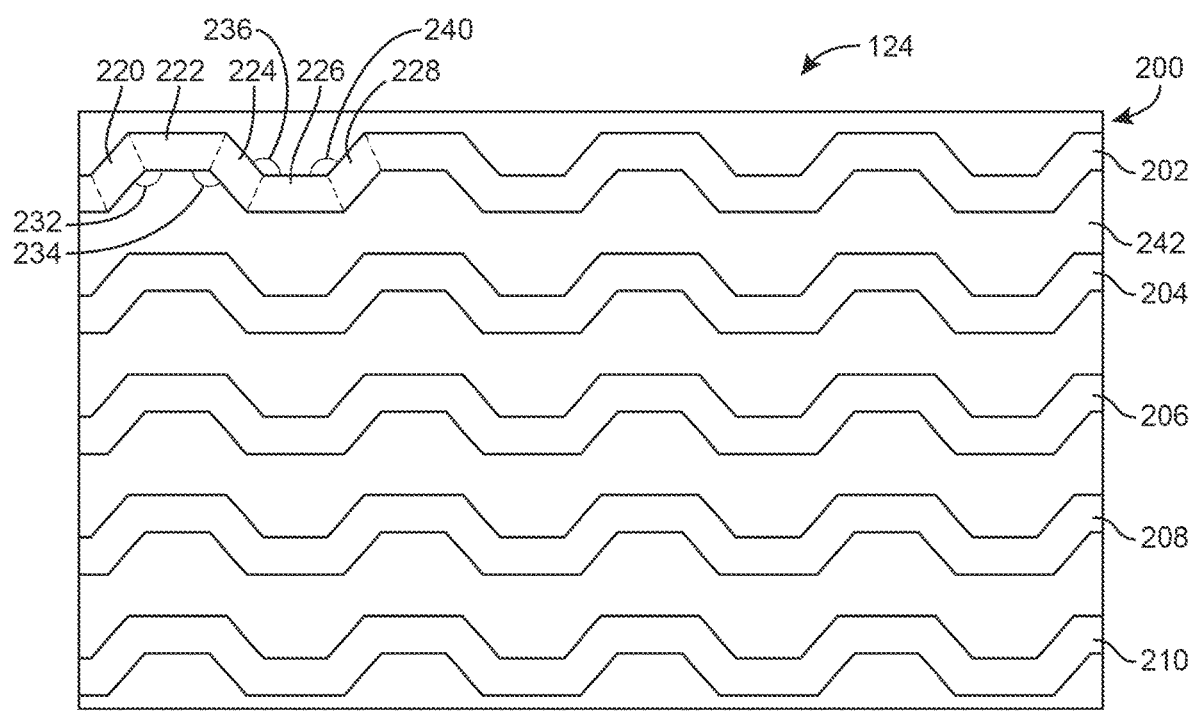
FIG. 8 is a more detailed view of top view schematic drawing of conductive traces in a serpentine configuration according to some embodiments.

With reference to FIG. 8, serpentine portion 124 is provided according to a pattern 200. Pattern 200 includes traces 202, 204, 206, 208, and 210. Traces 202, 204, 206, 208, and 210 are each formed from a repeating unit of four linear segments 220, 222, 224, and 226 demarcated by dashed lines on trace 202. Segment 228 of the next unit is also shown. Segments 220 and 222 are disposed with respect to each other at an obtuse angle 232. Segments 222 and 224 are disposed with respect to each other at an obtuse angle 234. Segments 224 and 226 are disposed with respect to each other at an obtuse angle 236. Segments 226 and 228 are disposed with respect to each other at an obtuse angle 240. Angles 232, 234, 236 and 240 can be from 91 to 179 degrees (e.g., between 120 and 150 degrees). In some embodiments, angles 232, 234, 236 and 240 are 135 degrees.

Pattern 200 can be adjusted in a variety of fashions. For example segments 220, 222, 224, and 226 can be curved and angles 232, 234, 236 and 240 can be adjusted. Design tools can be used to round corners of segments 220, 222, 224, and 226. The frequency, period, and amplitude associated with the pattern 200 can be adjusted. The distance 242 between adjacent traces 202, 204, 206, 208 and 210 is relatively constant. In some embodiments, the distance 242 between traces 202, 204, 206, 208 and 210 is at least twice the width of the traces 202, 204, 206, 208 and 210.

Figure 9:
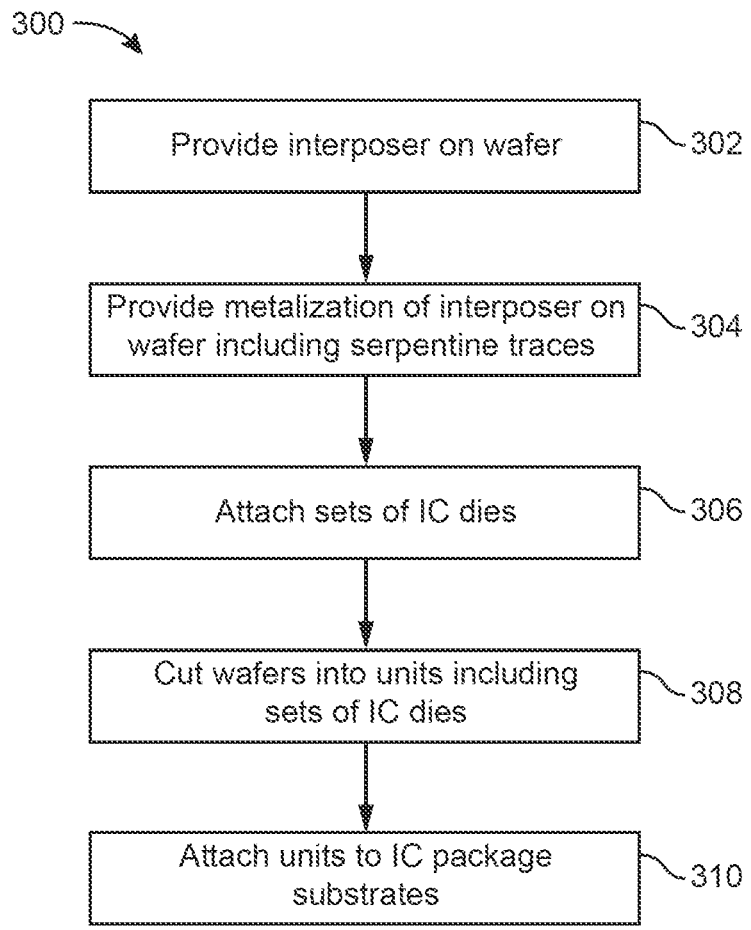
FIG. 9 is a flow diagram showing exemplary operations for fabricating the IC package illustrated in FIG. 3 according to some embodiments.

With reference to FIG. 9, a flow 300 is performed to fabricate the IC package 40 with traces in a serpentine configuration. Flow 300 is exemplary only and is not limited to operations performed in a particular order.

At an operation 302, an interposer wafer (e.g., interposer wafer 12 (FIG. 1)) is provided. The interposer wafer is an organic wafer in some embodiments. At an operation 304, the interposer wafer is subjected to metallization operations to form traces disposed in a serpentine configuration as discussed above. The wafer can be masked and etched in metallization operations at various layers to provide traces in a serpentine configuration. The traces in the serpentine configurations are provided at locations between anticipated attachment sites for the IC die (e.g. die 56 and 58 (FIG. 2)).

At an operation 306, one or more die (e.g., die 56 and 58) are attached to the interposer wafer or other circuit board/substrate for housing die. The die 56 and 58 are attached by flip chip technology using solder balls or bumps. Other techniques for attaching die 56 and 58 to die substrate or interposer board 42 include adhesives, wire bonding, and pins.

At an operation 308, the interposer wafer is cut to provide units containing IC die on the interposer board (e.g., interposer board 42 (FIG. 3)). At an operation 310, the cut portions of the interposer board are attached to a package substrate. A cover is provided over the package substrate and the cut portion of the interposer board. Heating and curing operations during package manufacture (operation 308) (e.g., associated with epoxy curing and other fabrication steps) can cause warpage that is advantageously handled by the serpentine portion provided in operation 304.

The dimensions, thicknesses, configurations and materials disclosed herein are exemplary only. Although only a side-by-side multichip configuration is shown, additional layers and configurations including die can be added (e.g., three die stack configuration or more) in some embodiments.

The disclosure is described above with reference to drawings. These drawings illustrate certain details of specific embodiments that implement the systems and methods and programs of the present disclosure. However, describing the disclosure with drawings should not be construed as imposing on the disclosure any limitations that are present in the drawings. The embodiments of the present disclosure can be implemented using various types of die. No claim element herein is to be construed as a "means plus function" element unless the element is expressly recited using the phrase "means for." Furthermore, no element, component or method step in the present disclosure is intended to be dedicated to the public, regardless of whether the element, component or method step is explicitly recited in the claims.

It should be noted that certain passages of this disclosure can reference terms such as "first" and "second" in connection with devices for purposes of identifying or differentiating one from another or from others. These terms are not intended to relate entities or operations (e.g., a first region and a second region) temporally or according to a sequence, although in some cases, these entities can include such a relationship. Nor do these terms limit the number of possible entities or operations.

It should be understood that the circuits described above can provide multiple ones of any or each of those components. In addition, the structures, circuits and methods described above can be adjusted for various system parameters and design criteria, such as shape, depth, thicknesses, material, etc. Although shown in the drawings with certain components directly coupled to each other, direct coupling is not shown in a limiting fashion and is exemplarily shown. Alternative embodiments include circuits with indirect coupling or indirect attachment between the components shown.

It should be noted that although steps are described in an order, it is understood that the order of these steps can differ from what is depicted. Also two or more steps can be performed concurrently or with partial concurrence. Such variation will depend on the recipes and systems chosen and on designer choice. It is understood that all such variations are within the scope of the disclosure.

While the foregoing written description of the methods and systems enables one of ordinary skill to make and use what is considered presently to be the best-mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A package, comprising:
   one or more die; and
   an interposer coupled to the die, wherein the interposer comprises circuit traces, wherein the circuit traces are provided in a serpentine configuration, wherein the serpentine configuration provides a spring-like characteristic allowing the circuit traces to deform under stress and return to original state undamaged better than a non-serpentine circuit trace.

2. The package of claim 1, wherein the interposer comprises a flexible material.

3. The package of claim 2, wherein the flexible material comprises an organic material.

4. The package of claim 1, wherein the interposer comprises an organic material.

5. The package of claim 1, wherein the circuit traces in the serpentine configuration are provided in gaps between two or more die of the one or more die.

6. The package of claim 1, wherein the circuit traces in the serpentine configuration comprise copper.

7. The package of claim 1, wherein the circuit traces in the serpentine configuration are provided on a portion of the interposer associated with high stress form bending.

8. An apparatus comprising:
   two or more die, each comprising an integrated circuit;
   an interposer board coupled to the two or more die, wherein the interposer board comprises circuit traces having a serpentine configuration, wherein the serpentine configuration provides a spring-like characteristic allowing the circuit traces to deform under stress and return to original state undamaged better than a non-serpentine circuit trace.

9. The package of claim 1, wherein the serpentine configuration is comprised of repeating units, wherein each repeating unit comprises four segments.

10. The package of claim 9, wherein a base segment is provided between two side segments at an obtuse interior angle.

11. An apparatus comprising:
    two or more die, each comprising an integrated circuit;
    an interposer board coupled to the two or more die, wherein the interposer board comprises circuit traces having a configuration that allows the circuit traces to deform under stress, and return to an original state undamaged more readily than a straight conductive trace.

12. The apparatus of claim 11, wherein the interposer board is a non-rigid circuit board.

13. The apparatus of claim 12, wherein the interposer board comprises organic material.

14. The apparatus of claim 11, wherein the configuration is a serpentine configuration.

15. The apparatus of claim 14, wherein the serpentine configuration is comprised of repeating units, wherein each repeating unit comprises six segments, wherein a base segment is provided between two side segments at an obtuse interior angle.

16. An apparatus, comprising:
    an interposer, wherein the interposer comprises circuit traces, wherein the circuit traces are provided in a serpentine configuration;
    a first die attached to the interposer;
    a second die attached to the interposer, the second die being separated from the first die by an area, wherein the area comprises at least a portion of the circuit traces in the serpentine configuration, wherein the circuit traces are separated by a consistent gap in the serpentine configuration that allows the circuit traces to deform under stress, and return to an original state undamaged more readily than a straight conductive trace.

17. The apparatus of claim 16, further comprising:
    a package substrate attached to the interposer.

18. The apparatus of claim 16, wherein the interposer comprises organic material.

19. The apparatus of claim 16, wherein the circuit traces are comprised of repeating units, wherein each repeating unit comprises six segments, wherein a base segment is provided between two side segments at an obtuse interior angle.

20. The apparatus of claim 8, wherein the circuit traces are separated by a consistent gap in the serpentine configuration.

* * * * *